(12) United States Patent
 Xiong (10) Patent No.: US 10,795,256 B2
(45) Date of Patent: Oct. 6, 2020

(54) OPTICAL COMPENSATION FILM, PHOTOMASK, AND EXPOSURE APPARATUS

(71) Applicant: Wuhan China Star Optoelectronics Technology Co., Ltd., Wuhan (CN)

(72) Inventor: Xing Xiong, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/340,149

(22) PCT Filed: Dec. 26, 2018

(86) PCT No.: PCT/CN2018/123805
§ 371 (c)(1),
(2) Date: Apr. 8, 2019

(87) PCT Pub. No.: WO2019/129031
PCT Pub. Date: Jul. 4, 2019

(65) Prior Publication Data
US 2020/0142295 A1 May 7, 2020

(30) Foreign Application Priority Data

Dec. 26, 2017 (CN) .......................... 2017 1 1435037

(51) Int. Cl.
 *G03F 1/38* (2012.01)
 *G03F 7/20* (2006.01)
 *B29D 11/00* (2006.01)
(52) U.S. Cl.
 CPC .............. *G03F 1/38* (2013.01); *G03F 7/7015* (2013.01); *B29D 11/00788* (2013.01)

(58) Field of Classification Search
 CPC ... G03F 1/38; G03F 7/7015; B29D 11/00788; G02B 5/0231; G02B 5/04; G02B 5/045;
 (Continued)

(56) References Cited

U.S. PATENT DOCUMENTS 4,793,694 A 12/1988 Liu
6,443,579 B1 * 9/2002 Myers .................... G02B 5/045
 359/601

(Continued)

FOREIGN PATENT DOCUMENTS

CN 101276014 10/2008
CN 101285965 10/2008
(Continued)

*Primary Examiner* — Manav Seth (57) ABSTRACT

The present disclosure provides an optical compensation film, a photomask, and an exposure apparatus. The optical compensation film includes a first region of the optical compensation film and a second region of the optical compensation film. The first region of the optical compensation film is positioned to correspond to an overlapping portion of the prisms, and is configured to allow light to pass therethrough and impinge on the overlapping portion of the prisms. The second region of the optical compensation film is positioned to correspond to a non-overlapping portion of the prisms, and is configured to allow light to pass therethrough and impinge on the non-overlapping portion of the prisms. Light transmittance of the first region of the optical compensation film is greater than light transmittance of the second region of the optical compensation film.

20 Claims, 3 Drawing Sheets

(58) Field of Classification Search
CPC .. G02B 5/1814; G02B 6/0016; G02B 6/0025; G02B 6/0036; G02B 6/0053; G02B 27/0972; G02B 27/0977; H04N 1/488; H04N 13/346; G06K 7/10831; G06K 9/00046

See application file for complete search history.

(56) References Cited

U.S. PATENT DOCUMENTS

| | | | | |
|---|---|---|---|---|
| 7,072,096 | B2* | 7/2006 | Holman | G02B 27/147 359/298 |
| 7,529,048 | B2* | 5/2009 | Lin | G02B 5/04 359/625 |
| 7,693,389 | B2* | 4/2010 | Kamijima | G02F 1/133553 385/147 |
| 7,835,079 | B2* | 11/2010 | El-Ghoroury | G03B 21/625 359/456 |
| 9,030,643 | B2* | 5/2015 | Hayashi | G02B 30/27 349/193 |
| 9,316,923 | B2* | 4/2016 | Kim | G03F 7/7035 |
| 9,488,844 | B2* | 11/2016 | Kim | G02B 30/27 |
| 10,409,337 | B2* | 9/2019 | Jin | G02B 5/04 |
| 2002/0163728 | A1* | 11/2002 | Myers | G02B 5/045 359/613 |
| 2005/0122601 | A1* | 6/2005 | Takeuchi | G02B 17/006 359/831 |
| 2005/0280894 | A1* | 12/2005 | Hartkop | H04N 13/31 359/464 |
| 2008/0239211 | A1 | 10/2008 | Suzuki et al. | |
| 2008/0259268 | A1 | 10/2008 | Nakajima et al. | |
| 2009/0168028 | A1* | 7/2009 | Magarill | G03B 21/28 353/81 |
| 2010/0240840 | A1* | 9/2010 | Toyama | C08F 283/006 525/450 |
| 2011/0164318 | A1* | 7/2011 | Yun | H04N 13/324 359/463 |
| 2012/0039078 | A1* | 2/2012 | Masuda | G02F 1/133606 362/311.03 |
| 2016/0221279 | A1 | 8/2016 | Ohya et al. | |
| 2017/0153364 | A1 | 6/2017 | Kanno et al. | |
| 2017/0192139 | A1 | 7/2017 | Wang et al. | |
| 2019/0356889 | A1* | 11/2019 | Wu | G02B 6/0031 |

FOREIGN PATENT DOCUMENTS

| | | |
|---|---|---|
| CN | 102575028 | 7/2012 |
| CN | 102778710 | 11/2012 |
| CN | 104536258 | 4/2015 |
| CN | 105629354 | 6/2016 |
| JP | 2009-160613 | 7/2009 |

* cited by examiner

OPTICAL COMPENSATION FILM, PHOTOMASK, AND EXPOSURE APPARATUS

RELATED APPLICATIONS

This application is a National Phase of PCT Patent Application No. PCT/CN2018/123805 having International filing date of Dec. 26, 2018, which claims the benefit of priority of Chinese Patent Application No. 201711435037.7 filed on Dec. 26, 2017. The contents of the above applications are all incorporated by reference as if fully set forth herein in their entirety.

FIELD AND BACKGROUND OF INVENTION

The present disclosure relates to a field of display technology, and more particularly, to an optical compensation film, a photomask, and an exposure apparatus.

Having advantages of high color saturation and low power consumption, liquid crystal displays (LCDs) become mainstream in field of display technology.

During a process of manufacturing LCDs, an exposure apparatus is used to transfer patterns on a photomask to a glass substrate. Among various exposure apparatuses, exposure apparatuses produced by NIKON Corporation are widely used because of high precision and easy adjustment.

Figures 1, 2:
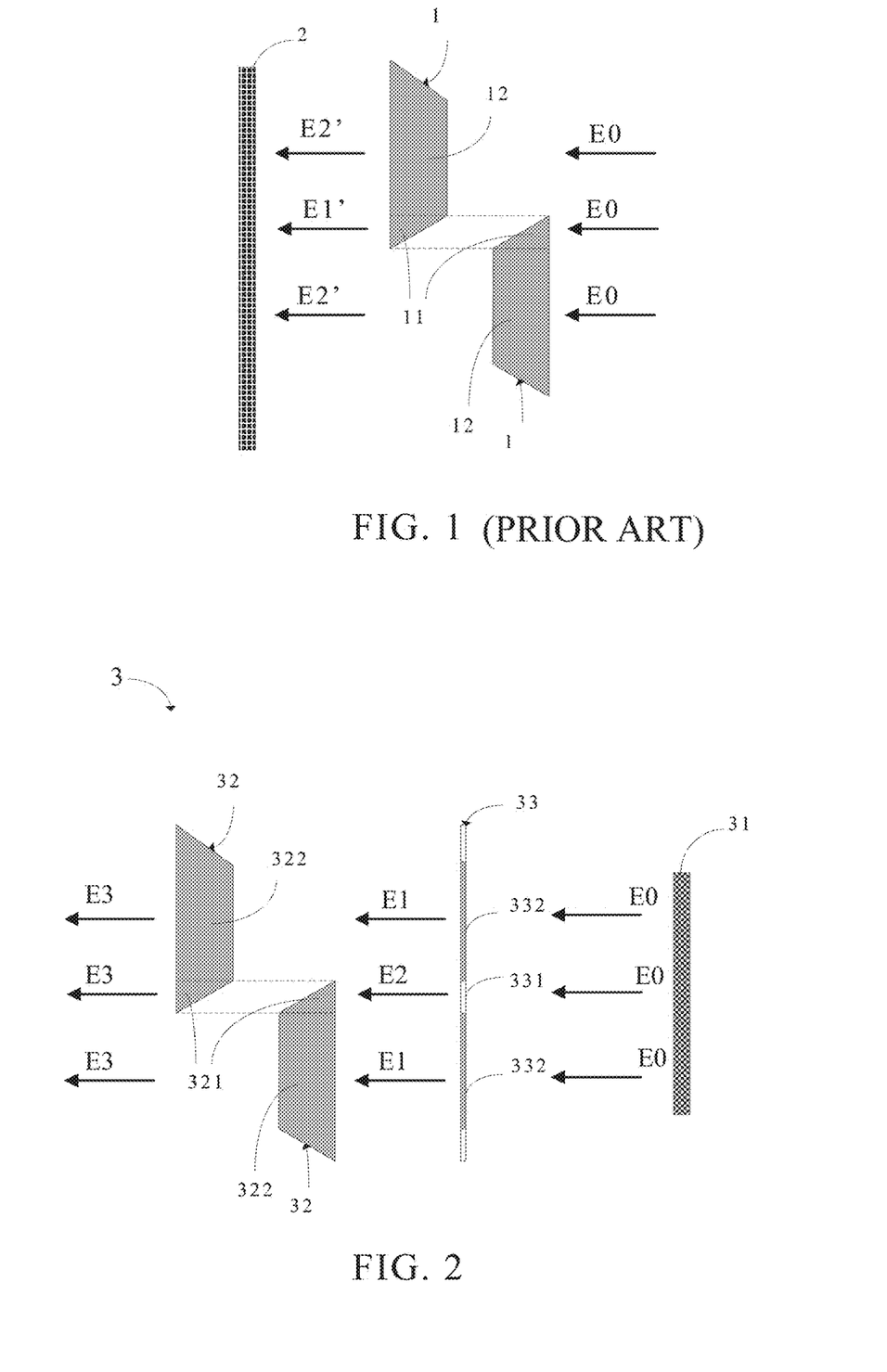
FIG. 1 is a schematic diagram showing a structure of an exposure apparatus according to prior art.
FIG. 2 is a schematic diagram showing a structure of an exposure apparatus according to one embodiment of the present disclosure.

As shown in FIG. 1, exposure apparatuses produced by NIKON Corporation adopt a mode where exposure is carried out while scanning is executed at the same time. Light having intensity of E0, after passing through a plurality of prisms 1 that overlap with each other, impinges on a substrate 2 to realize exposure. However, since intensity E1' of light having passed through an overlapping portion 11 of prisms is less than intensity E2' of light having passed through a non-overlapping portion 12 of prisms, exposure intensity of light on substrate 2 is not uniform. This deteriorates display performance of LCDs.

SUMMARY OF THE INVENTION

The objective of the present disclosure is to provide an optical compensation film, a photomask, and an exposure apparatus, so as to make the display panels be uniformly exposed and raise display performance of display panels.

The present disclosure provides an optical compensation film used for an exposure apparatus, the exposure apparatus including a plurality of prisms, and two adjacent prisms partially overlapping each other to define an overlapping portion and a non-overlapping portion, wherein the optical compensation film comprises a first region of the optical compensation film and a second region of the optical compensation film;

the first region of the optical compensation film is positioned to correspond to the overlapping portion of the prisms, and the first region of the optical compensation film is configured to allow light to pass therethrough and impinge on the overlapping portion of the prisms;

the second region of the optical compensation film is positioned to correspond to the non-overlapping portion of the prisms, and the second region of the optical compensation film is configured to allow light to pass therethrough and impinge on the non-overlapping portion of the prisms; and wherein light transmittance of the first region of the optical compensation film is greater than light transmittance of the second region of the optical compensation film.

In some embodiments, the second region of the optical compensation film is made of a material including one or more of nitrocellulose, cellulose ester, and polytetrafluoroethylene; the first region of the optical compensation film is made of a material including one or more of nitrocellulose, cellulose ester, and polytetrafluoroethylene; and a thickness of the first region of the optical compensation film is less than a thickness of the second region of the optical compensation film.

In some embodiments, the thickness of the second region of the optical compensation film ranges from 0.5 µm to 3 µm, and the thickness of the second region of the optical compensation film is greater than the thickness of the first region of the optical compensation film by 0.2-1 µm.

In some embodiments, the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the first region of the optical compensation film is doped with a doping material including one or more of magnesium fluoride and a siloxane hybrid film.

In some embodiments, a ratio of the doping material in the first region of the optical compensation film to the major material in the first region of the optical compensation film is between 0.05% and 0.5%.

In some embodiments, the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the second region of the optical compensation film is doped with a doping material including cellulose acetate.

In some embodiments, both the first region of the optical compensation film and the second region of the optical compensation film include a light transmitting layer, the second region of the optical compensation film further includes a light shielding layer, and light transmittance of the light shielding layer is less than light transmittance of the light transmitting layer.

In some embodiments, the light transmitting layer is made of a material including one or more of nitrocellulose, cellulose ester, and polytetrafluoroethylene; and the light shielding layer is made of a material including cellulose acetate.

The present disclosure further provides a photomask, comprising: a baseplate, a light blocking film, a plurality of supporting posts, and an optical compensation film;

wherein the optical compensation film comprises a first region of the optical compensation film and a second region of the optical compensation film; the first region of the optical compensation film is positioned to correspond to an overlapping portion of a plurality of prisms, and the first region of the optical compensation film is configured to allow light to pass therethrough and impinge on the overlapping portion of the prisms; the second region of the optical compensation film is positioned to correspond to a non-overlapping portion of the prisms, and the second region of the optical compensation film is configured to allow light to pass therethrough and impinge on the non-overlapping portion of the prisms; wherein light transmittance of the first region of the optical compensation film is greater than light transmittance of the second region of the optical compensation film;

wherein the light blocking film is disposed on the baseplate; and wherein the support posts are disposed on the light blocking film to support the optical compensation film.

In some embodiments, the second region of the optical compensation film is made of a material including one or more of nitrocellulose, cellulose ester, and polytetrafluoroethylene; the first region of the optical compensation film is made of a material including one or more of nitrocellulose, cellulose ester, and polytetrafluoroethylene; and a thickness of the first region of the optical compensation film is less than a thickness of the second region of the optical compensation film.

In some embodiments, the thickness of the second region of the optical compensation film ranges from 0.5 μm to 3 μm, and the thickness of the second region of the optical compensation film is greater than the thickness of the first region of the optical compensation film by 0.2-1 μm.

In some embodiments, the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the first region of the optical compensation film is doped with a doping material including one or more of magnesium fluoride and a siloxane hybrid film.

In some embodiments, a ratio of the doping material in the first region of the optical compensation film to the major material in the first region of the optical compensation film is between 0.05% and 0.5%.

In some embodiments, the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the second region of the optical compensation film is doped with a doping material including cellulose acetate.

In some embodiments, both the first region of the optical compensation film and the second region of the optical compensation film include a light transmitting layer, the second region of the optical compensation film further includes a light shielding layer, and light transmittance of the light shielding layer is less than light transmittance of the light transmitting layer.

In some embodiments, the light transmitting layer is made of a material including one or more of nitrocellulose, cellulose ester, and polytetrafluoroethylene; and the light shielding layer is made of a material including cellulose acetate.

The present disclosure further provides an exposure apparatus, comprising: a light source, a plurality of prisms, and an optical compensation film disposed between the light source and the prisms;

wherein two adjacent prisms partially overlap each other to define an overlapping portion and a non-overlapping portion;

wherein the optical compensation film comprises a first region of the optical compensation film and a second region of the optical compensation film; the first region of the optical compensation film is positioned to correspond to the overlapping portion of the prisms, and the first region of the optical compensation film is configured to allow light to pass therethrough and impinge on the overlapping portion of the prisms; the second region of the optical compensation film is positioned to correspond to the non-overlapping portion of the prisms, and the second region of the optical compensation film is configured to allow light to pass therethrough and impinge on the non-overlapping portion of the prisms; wherein light transmittance of the first region of the optical compensation film is greater than light transmittance of the second region of the optical compensation film; and wherein the light source is configured to emit light towards the optical compensation film, where the light impinges on the overlapping portion of the prisms after passing through the first region of the optical compensation film, and the light impinges on the non-overlapping portion of the prisms after passing through the second region of the optical compensation film.

In some embodiments, the second region of the optical compensation film is made of a material including one or more of nitrocellulose, cellulose ester, and polytetrafluoroethylene; the first region of the optical compensation film is made of a material including one or more of nitrocellulose, cellulose ester, and polytetrafluoroethylene; and a thickness of the first region of the optical compensation film is less than a thickness of the second region of the optical compensation film.

In some embodiments, the thickness of the second region of the optical compensation film ranges from 0.5 μm to 3 μm, and the thickness of the second region of the optical compensation film is greater than the thickness of the first region of the optical compensation film by 0.2-1 μm.

In some embodiments, the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the first region of the optical compensation film is doped with a doping material including one or more of magnesium fluoride and a siloxane hybrid film.

Compared with prior art, the present disclosure provides an optical compensation films, a photomask, and an exposure apparatuses. Light transmittance of the first region of the optical compensation film is greater than light transmittance of the second region of the optical compensation film. The first region of the optical compensation film is positioned to correspond to the overlapping portion of the prisms, and the second region of the optical compensation film is positioned to correspond to the non-overlapping portion of the prisms. Thus, intensity of light impinging on the overlapping portion of the prisms is increased. Accordingly, exposure intensity of light on display panels is uniform, and display performance of display panels is raised.

BRIEF DESCRIPTION OF THE SEVERAL VIEWS OF THE DRAWINGS

In order to make the above content of the invention clearly understood, the preferable embodiments are exemplified as follows in conjunction with the accompanying drawings and the detailed description.

DESCRIPTIONS OF SPECIFIC EMBODIMENTS OF THE INVENTION

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto.

In the drawings, the same reference symbol represents the same or similar components.

The term "embodiment" referred to herein means that a particular feature, structure, or feature described in conjunction with the embodiment may be contained in at least one embodiment of the present disclosure. The phrase appearing in various places in the specification does not necessarily refer to the same embodiment, nor does it refer to an independent or alternative embodiment that is mutually exclusive with other embodiments. It is expressly and implicitly under stood by those skilled in the art that an embodiment described herein may be combined with other embodiments.

Please refer to FIG. 2. FIG. 2 is a schematic diagram showing a structure of an exposure apparatus according to one embodiment of the present disclosure. The exposure apparatus 3 includes a light source 31, a plurality of prisms 32, and an optical compensation film 33 disposed between the light source 31 and the prisms 32.

Among the prisms 32, two adjacent prisms 32 partially overlap with each other to define an overlapping portion 321 and a non-overlapping portion 322. Please note that cross-sections of the prisms in the present embodiment could have a shape of a trapezoid, a triangle, or other shapes. The present disclosure is not limited thereto.

Figure 3:
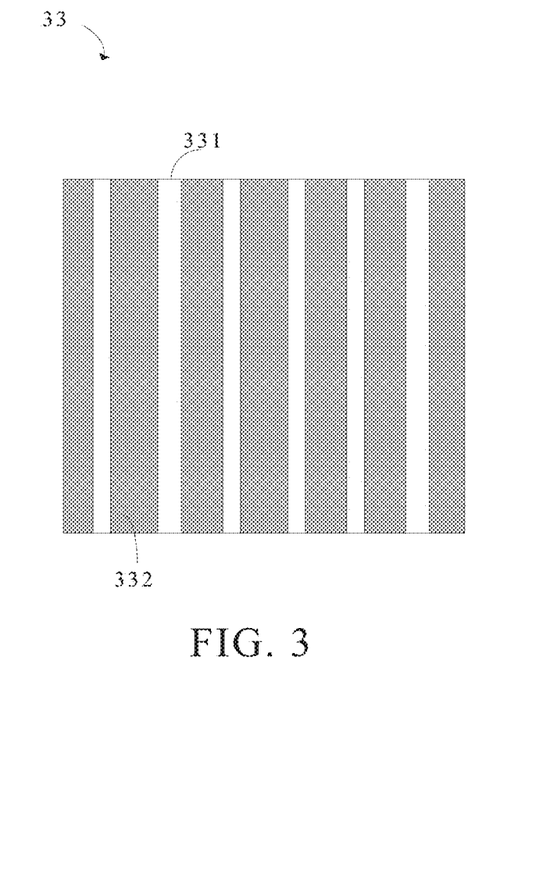
FIG. 3 is a schematic diagram showing a structure of an optical compensation film according to one embodiment of the present disclosure.

As shown in FIG. 2 or FIG. 3, the optical compensation film 33 comprises a first region 331 of the optical compensation film and a second region 332 of the optical compensation film. The first region 331 of the optical compensation film is positioned to correspond to the overlapping portion 321 of the prisms, and the second region 332 of the optical compensation film is positioned to correspond to the non-overlapping portion 322 of the prisms. Light transmittance of the first region 331 of the optical compensation film is greater than light transmittance of the second region 332 of the optical compensation film.

In some embodiments, the second region 332 of the optical compensation film is made of a material including one or more of nitrocellulose, cellulose ester, and polytetrafluoroethylene. The first region 331 of the optical compensation film is made of a material including one or more of nitrocellulose, cellulose ester, and polytetrafluoroethylene. That is, the first region 331 of the optical compensation film and the second region 332 of the optical compensation film are made of the same material. Please note that a thickness of the first region 331 of the optical compensation film is less than a thickness of the second region 332 of the optical compensation film. In other words, light transmittance of the first region 331 of the optical compensation film is greater than light transmittance of the second region 332 of the optical compensation film.

Preferably, the thickness of the second region 332 of the optical compensation film ranges from 0.5 μm to 3 μm. On such a basis, the thickness of the second region 332 of the optical compensation film is greater than the thickness of the first region 331 of the optical compensation film by 0.2-1 μm.

In some embodiments, the second region 332 of the optical compensation film is made of a material including one or more of nitrocellulose, cellulose ester, and polytetrafluoroethylene. The first region 331 of the optical compensation film is made of a major material including one or more of nitrocellulose, cellulose ester, and polytetrafluoroethylene. The first region 331 of the optical compensation film is doped with a doping material including one or more of magnesium fluoride and a siloxane hybrid film. Since light transmittance of the doping material (such as, magnesium fluoride, and the siloxane hybrid film) is greater than light transmittance of the major material (such as nitrocellulose, cellulose ester, and polytetrafluoroethylene), the first region 331 of the optical compensation film with magnesium fluoride or the siloxane hybrid film incorporated therein has light transmittance greater than light transmittance of the second region 332 of the optical compensation film. Preferably, for the first region 331 of the optical compensation film, a ratio of the doping material to the major material is between 0.05% and 0.5%.

In some embodiments, the second region 332 of the optical compensation film is made of a material including one or more of nitrocellulose, cellulose ester, and polytetrafluoroethylene. The first region 331 of the optical compensation film is made of a major material including one or more of nitrocellulose, cellulose ester, and polytetrafluoroethylene. The second region 332 of the optical compensation film is doped with a doping material including cellulose acetate. Since light transmittance of the doping material (such as cellulose acetate) is less than light transmittance of the major material (such as nitrocellulose, cellulose ester, and polytetrafluoroethylene), the second region 332 of the optical compensation film with cellulose acetate incorporated therein has light transmittance less than light transmittance of the first region 331 of the optical compensation film. In other words, light transmittance of the first region 331 of the optical compensation film is greater than light transmittance of the second region 332 of the optical compensation film.

Figure 4:
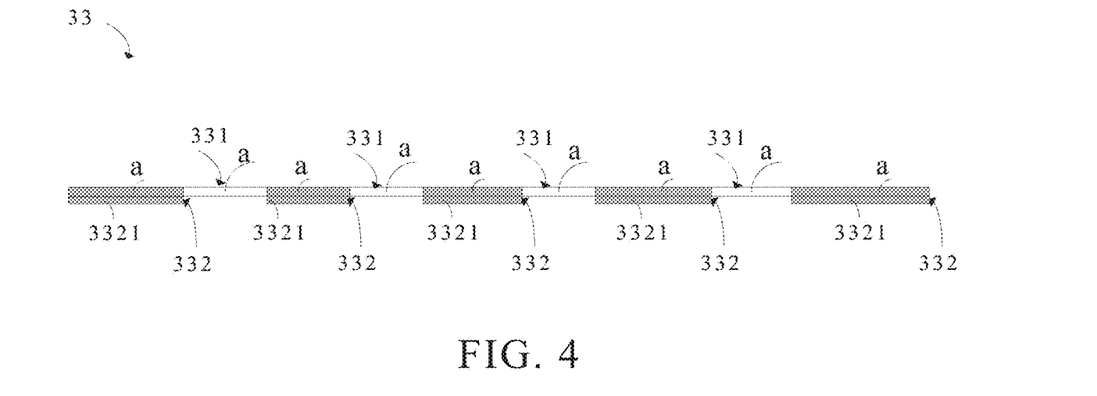
FIG. 4 is a schematic diagram showing another structure of an optical compensation film according to one embodiment of the present disclosure.

Please see FIG. 4. In some embodiments, the first region 331 of the optical compensation film includes a light transmitting layer a. The second region 332 of the optical compensation film include a light transmitting layer a. The second region 332 of the optical compensation film further includes a light shielding layer 3321. Light transmittance of the light shielding layer 3321 is less than light transmittance of the light transmitting layer a.

Preferably, the light transmitting layer a is made of a material including one or more of nitrocellulose, cellulose ester, and polytetrafluoroethylene. The light shielding layer 3321 is made of a material including cellulose acetate. Similarly, since light transmittance of cellulose acetate is less than light transmittance of nitrocellulose, cellulose ester, and polytetrafluoroethylene, the light shielding layer 3321 can reduce intensity of light impinging on the non-overlapping portion 322 of the prisms.

The light source 31 is configured to emit light towards the optical compensation film 33. The light impinges on the overlapping portion 321 of the prisms after passing through the first region 331 of the optical compensation film, and the light impinges on the non-overlapping portion 322 of the prisms after passing through the second region 332 of the optical compensation film. As can be seen in FIG. 2, light emitted by the light source 31 has intensity of E0. After light passes through the second region 332 of the optical compensation film, light impinges on the non-overlapping portion 322 of the prisms, and has intensity of E1. After light passes through the first region 331 of the optical compensation film, light impinges on the overlapping portion 321 of the prisms, and has intensity of E2. Because light transmittance of the first region 331 of the optical compensation film is greater than light transmittance of the second region 332 of the optical compensation film, E2>E1. For this reason, light after further passing through the overlapping portion 321 and light after further passing through the non-overlapping portion 322 both have the same intensity of E3. Thereafter, light having intensity of E3 will impinge on a surface of a substrate, and thus uniform exposure intensity of light can be realized.

Figure 5:
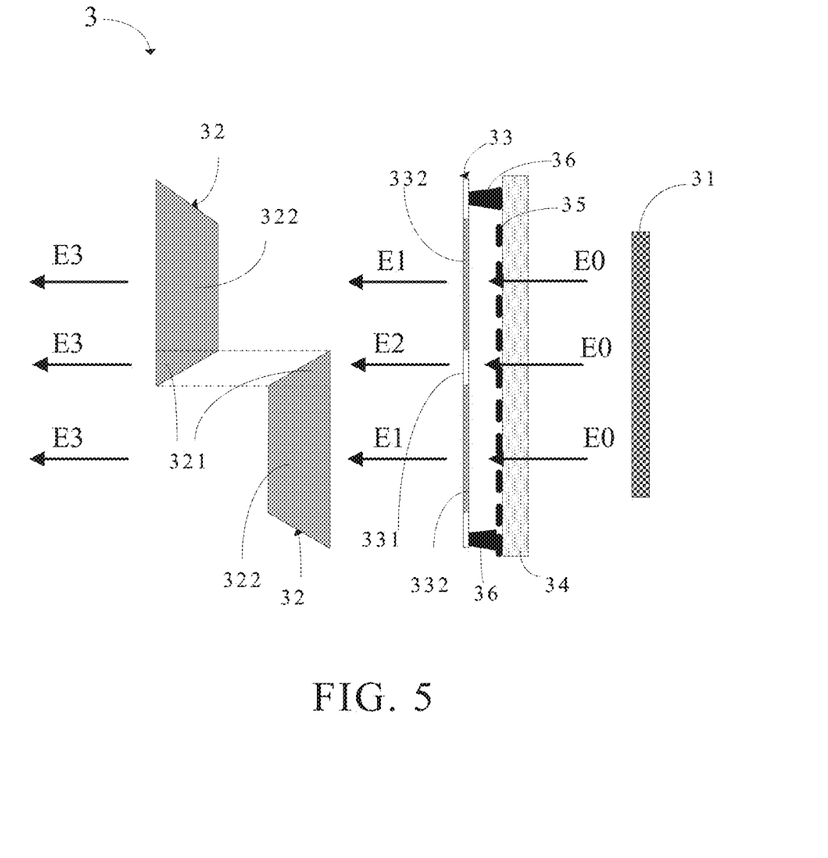
FIG. 5 is a schematic diagram showing another structure of an exposure apparatus according to one embodiment of the present disclosure.

Please see FIG. 5. In some embodiments, the exposure apparatus 3 further includes a baseplate 34, a light blocking film 35, and a plurality of supporting posts 36. Generally, the light blocking film 35 is a chromium film, and is coated on the baseplate 34 to define an exposure region. The supporting posts 36 are disposed on the light blocking film 35, and are used to support the optical compensation film 33.

The present disclosure further provides an optical compensation film, as shown in FIGS. 3 and 4. The optical compensation film 33 is used for the exposure apparatus. That is, the optical compensation film 33 can be independent from the exposure apparatus. The exposure apparatus includes a plurality of prisms, and two adjacent prisms partially overlap with each other to define an overlapping portion and a non-overlapping portion.

The optical compensation film 33 comprises a first region 331 of the optical compensation film and a second region 332 of the optical compensation film. The first region 331 of the optical compensation film is positioned to correspond to the overlapping portion 321 of the prisms, and is configured to allow light to pass therethrough and impinge on the overlapping portion 321 of the prisms. The second region 332 of the optical compensation film is positioned to correspond to the non-overlapping portion 322 of the prisms, and is configured to allow light to pass therethrough and impinge on the non-overlapping portion 322 of the prisms. Light transmittance of the first region 331 of the optical compensation film is greater than light transmittance of the second region 332 of the optical compensation film. As shown in FIG. 2, light impinging on the optical compensation film 33 has intensity of E0. After light passes through the second region 332 of the optical compensation film, light impinges on the non-overlapping portion 322 of the prisms, and has intensity of E1. After light passes through the first region 331 of the optical compensation film, light impinges on the overlapping portion 321 of the prisms, and has intensity of E2. Because light transmittance of the first region 331 of the optical compensation film is greater than light transmittance of the second region 332 of the optical compensation film, E2>E1. For this reason, light after further passing through the overlapping portion 321 and light after further passing through the non-overlapping portion 322 both have the same intensity of E3. Thereafter, light having intensity of E3 will impinge on the surface of the substrate, and thus uniform exposure intensity of light can be realized.

In some embodiments, the second region 332 of the optical compensation film is made of a material including one or more of nitrocellulose, cellulose ester, and polytetrafluoroethylene. The first region 331 of the optical compensation film is made of a material including one or more of nitrocellulose, cellulose ester, and polytetrafluoroethylene. That is, the first region 331 of the optical compensation film and the second region 332 of the optical compensation film are made of the same material. Please note that the thickness of the first region 331 of the optical compensation film is less than the thickness of the second region 332 of the optical compensation film. In other words, light transmittance of the first region 331 of the optical compensation film is greater than light transmittance of the second region 332 of the optical compensation film.

Preferably, the thickness of the second region 332 of the optical compensation film ranges from 0.5 μm to 3 μm. On such a basis, the thickness of the second region 332 of the optical compensation film is greater than the thickness of the first region 331 of the optical compensation film by 0.2-1 μm.

In some embodiments, the second region 332 of the optical compensation film is made of a material including one or more of nitrocellulose, cellulose ester, and polytetrafluoroethylene. The first region 331 of the optical compensation film is made of a major material including one or more of nitrocellulose, cellulose ester, and polytetrafluoroethylene. The first region 331 of the optical compensation film is doped with a doping material including one or more of magnesium fluoride and the siloxane hybrid film. Since light transmittance of the doping material (such as magnesium fluoride and the siloxane hybrid film) is greater than light transmittance of the major material (such as nitrocellulose, cellulose ester, and polytetrafluoroethylene), the first region 331 of the optical compensation film with magnesium fluoride or the siloxane hybrid film incorporated therein has light transmittance greater than light transmittance of the second region 332 of the optical compensation film. Preferably, for the first region 331 of the optical compensation film, a ratio of the doping material to the major material is between 0.05% and 0.5%.

In some embodiments, the second region 332 of the optical compensation film is made of a material including one or more of nitrocellulose, cellulose ester, and polytetrafluoroethylene. The first region 331 of the optical compensation film is made of a major material including one or more of nitrocellulose, cellulose ester, and polytetrafluoroethylene. The second region 332 of the optical compensation film is doped with a doping material including cellulose acetate. Since light transmittance of the doping material (such as cellulose acetate) is less than light transmittance of the major material (such as nitrocellulose, cellulose ester, and polytetrafluoroethylene), the second region 332 of the optical compensation film with cellulose acetate incorporated therein has light transmittance less than light transmittance of the first region 331 of the optical compensation film. In other words, light transmittance of the first region 331 of the optical compensation film is greater than light transmittance of the second region 332 of the optical compensation film.

Please see FIG. 4. In some embodiments, the first region 331 of the optical compensation film includes the light transmitting layer a. The second region 332 of the optical compensation film include the light transmitting layer a. The second region 332 of the optical compensation film further includes a light shielding layer 3321. Light transmittance of the light shielding layer 3321 is less than light transmittance of the light transmitting layer a.

Preferably, the light transmitting layer a is made of a material including one or more of nitrocellulose, cellulose ester, and polytetrafluoroethylene. The light shielding layer 3321 is made of a material including cellulose acetate.

Figure 6:
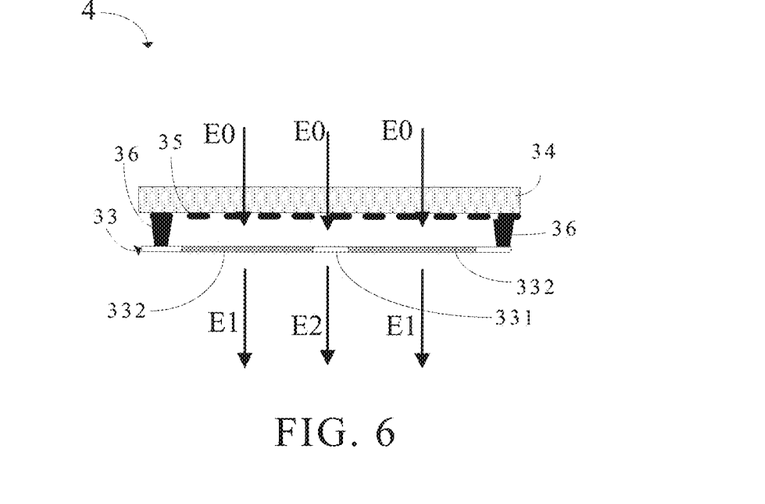
FIG. 6 is a schematic diagram showing a structure of a photomask according to one embodiment of the present disclosure.

Please see FIG. 6. The present disclosure further provides a photomask 4. The photomask 4 includes an optical compensation film 33, a baseplate 34, a light blocking film 35, and a plurality of supporting posts 36. Generally, the light blocking film 35 is a chromium film, and is coated on the baseplate 34 to define an exposure region. The supporting posts 36 are disposed on the light blocking film 35, and are used to support the optical compensation film 33. Please be understood that the optical compensation film 33 can be independent from the exposure apparatus, and the optical compensation film 33 could be installed in the exposure apparatus if needed.

As shown in FIG. 3, FIG. 4, or FIG. 6, the optical compensation film 33 comprises a first region 331 of the optical compensation film and a second region 332 of the optical compensation film. The first region 331 of the optical compensation film is positioned to correspond to the overlapping portion 321 of the prisms, and is configured to allow light to pass therethrough and impinge on the overlapping portion 321 of the prisms. The second region 332 of the optical compensation film is positioned to correspond to the non-overlapping portion 322 of the prisms, and is configured to allow light to pass therethrough and impinge on the non-overlapping portion 322 of the prisms. Light transmittance of the first region 331 of the optical compensation film is greater than light transmittance of the second region 332 of the optical compensation film. As shown in FIG. 2, light impinging on the optical compensation film 33 has intensity of E0. After light passes through the second region 332 of the optical compensation film, light impinges on the non-overlapping portion 322 of the prisms, and has intensity of E1. After light passes through the first region 331 of the optical compensation film, light impinges on the overlapping portion 321 of the prisms, and has intensity of E2. Because light transmittance of the first region 331 of the optical compensation film is greater than light transmittance of the second region 332 of the optical compensation film, E2>E1. For this reason, light after further passing through the overlapping portion 321 and light after further passing through the non-overlapping portion 322 both have the same intensity of E3. Thereafter, light having intensity of E3 will impinge on the surface of the substrate, and thus uniform exposure intensity of light can be realized.

Please note that the optical compensation film 33 can be independent from the exposure apparatus 3.

In some embodiments, the second region 332 of the optical compensation film is made of a material including one or more of nitrocellulose, cellulose ester, and polytetrafluoroethylene. The first region 331 of the optical compensation film is made of a material including one or more of nitrocellulose, cellulose ester, and polytetrafluoroethylene. That is, the first region 331 of the optical compensation film and the second region 332 of the optical compensation film are made of the same material. Please note that a thickness of the first region 331 of the optical compensation film is less than a thickness of the second region 332 of the optical compensation film. In other words, light transmittance of the first region 331 of the optical compensation film is greater than light transmittance of the second region 332 of the optical compensation film.

Preferably, the thickness of the second region 332 of the optical compensation film ranges from 0.5 μm to 3 μm. On such a basis, the thickness of the second region 332 of the optical compensation film is greater than the thickness of the first region 331 of the optical compensation film by 0.2-1 μm.

In some embodiments, the second region 332 of the optical compensation film is made of a material including one or more of nitrocellulose, cellulose ester, and polytetrafluoroethylene. The first region 331 of the optical compensation film is made of a major material including one or more of nitrocellulose, cellulose ester, and polytetrafluoroethylene. The first region 331 of the optical compensation film is doped with a doping material including one or more of magnesium fluoride and the siloxane hybrid film. Since light transmittance of the doping material (such as magnesium fluoride and the siloxane hybrid film) is greater than light transmittance of the major material (such as nitrocellulose, cellulose ester, and polytetrafluoroethylene), the first region 331 of the optical compensation film with magnesium fluoride or the siloxane hybrid film incorporated therein has light transmittance greater than light transmittance of the second region 332 of the optical compensation film. Preferably, for the first region 331 of the optical compensation film, a ratio of the doping material to the major material is between 0.05% and 0.5%.

In some embodiments, the second region 332 of the optical compensation film is made of a material including one or more of nitrocellulose, cellulose ester, and polytetrafluoroethylene. The first region 331 of the optical compensation film is made of a major material including one or more of nitrocellulose, cellulose ester, and polytetrafluoroethylene. The second region 332 of the optical compensation film is doped with a doping material including cellulose acetate. Since light transmittance of the doping material (such as cellulose acetate) is less than light transmittance of the major material (such as nitrocellulose, cellulose ester, and polytetrafluoroethylene), the second region 332 of the optical compensation film with cellulose acetate incorporated therein has light transmittance less than light transmittance of the first region 331 of the optical compensation film. In other words, light transmittance of the first region 331 of the optical compensation film is greater than light transmittance of the second region 332 of the optical compensation film.

Please see FIG. 4. In some embodiments, the first region 331 of the optical compensation film includes the light transmitting layer a. The second region 332 of the optical compensation film include the light transmitting layer a. The second region 332 of the optical compensation film further includes a light shielding layer 3321. Light transmittance of the light shielding layer 3321 is less than a light transmittance of the light transmitting layer a.

Preferably, the light transmitting layer a is made of a material including one or more of nitrocellulose, cellulose ester, and polytetrafluoroethylene. The light shielding layer 3321 is made of a material including cellulose acetate.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An optical compensation film used for an exposure apparatus, the exposure apparatus including a plurality of prisms, and two adjacent prisms partially overlapping with each other to define an overlapping portion and a non-overlapping portion, wherein the optical compensation film comprises a first region of the optical compensation film and a second region of the optical compensation film;

the first region of the optical compensation film is positioned to correspond to the overlapping portion of the prisms, and the first region of the optical compensation film is configured to allow light to pass therethrough and impinge on the overlapping portion of the prisms;

the second region of the optical compensation film is positioned to correspond to the non-overlapping portion of the prisms, and the second region of the optical compensation film is configured to allow light to pass therethrough and impinge on the non-overlapping portion of the prisms; and wherein light transmittance of the first region of the optical compensation film is greater than light transmittance of the second region of the optical compensation film.

2. The optical compensation film according to claim 1, wherein the second region of the optical compensation film is made of a material including one or more of nitrocellulose, cellulose ester, and polytetrafluoroethylene; the first region of the optical compensation film is made of a material including one or more of nitrocellulose, cellulose ester, and polytetrafluoroethylene; and a thickness of the first region of the optical compensation film is less than a thickness of the second region of the optical compensation film.

3. The optical compensation film according to claim 2, wherein the thickness of the second region of the optical compensation film ranges from 0.5 μm to 3 μm, and the thickness of the second region of the optical compensation film is greater than the thickness of the first region of the optical compensation film by 0.2-1 μm.

4. The optical compensation film according to claim 1, wherein the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the first region of the optical compensation film is doped with a doping material including one or more of magnesium fluoride and a siloxane hybrid film.

5. The optical compensation film according to claim 4, wherein a ratio of the doping material in the first region of the optical compensation film to the major material in the first region of the optical compensation film is between 0.05% and 0.5%.

6. The optical compensation film according to claim 1, wherein the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the second region of the optical compensation film is doped with a doping material including cellulose acetate.

7. The optical compensation film according to claim 1, wherein both the first region of the optical compensation film and the second region of the optical compensation film include a light transmitting layer, the second region of the optical compensation film further includes a light shielding layer, and light transmittance of the light shielding layer is less than light transmittance of the light transmitting layer.

8. The optical compensation film according to claim 7, wherein the light transmitting layer is made of a material including one or more of nitrocellulose, cellulose ester, and polytetrafluoroethylene; and the light shielding layer is made of a material including cellulose acetate.

9. A photomask, comprising: a baseplate, a light blocking film, a plurality of supporting posts, and an optical compensation film;

wherein the optical compensation film comprises a first region of the optical compensation film and a second region of the optical compensation film; the first region of the optical compensation film is positioned to correspond to an overlapping portion of a plurality of prisms, and the first region of the optical compensation film is configured to allow light to pass therethrough and impinge on the overlapping portion of the prisms; the second region of the optical compensation film is positioned to correspond to a non-overlapping portion of the prisms, and the second region of the optical compensation film is configured to allow light to pass therethrough and impinge on the non-overlapping portion of the prisms; wherein light transmittance of the first region of the optical compensation film is greater than light transmittance of the second region of the optical compensation film;

wherein the light blocking film is disposed on the baseplate; and wherein the support posts are disposed on the light blocking film to support the optical compensation film.

10. The photomask according to claim 9, wherein the second region of the optical compensation film is made of a material including one or more of nitrocellulose, cellulose ester, and polytetrafluoroethylene; the first region of the optical compensation film is made of a material including one or more of nitrocellulose, cellulose ester, and polytetrafluoroethylene; and a thickness of the first region of the optical compensation film is less than a thickness of the second region of the optical compensation film.

11. The photomask according to claim 10, wherein the thickness of the second region of the optical compensation film ranges from 0.5 μm to 3 μm, and the thickness of the second region of the optical compensation film is greater than the thickness of the first region of the optical compensation film by 0.2-1 μm.

12. The photomask according to claim 9, wherein the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the first region of the optical compensation film is doped with a doping material including one or more of magnesium fluoride and a siloxane hybrid film.

13. The photomask according to claim 12, wherein a ratio of the doping material in the first region of the optical compensation film to the major material in the first region of the optical compensation film is between 0.05% and 0.5%.

14. The photomask according to claim 9, wherein the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the second region of the optical compensation film is doped with a doping material including cellulose acetate.

15. The photomask according to claim 9, wherein both the first region of the optical compensation film and the second region of the optical compensation film include a light transmitting layer, the second region of the optical compensation film further includes a light shielding layer, and light transmittance of the light shielding layer is less than light transmittance of the light transmitting layer.

16. The photomask according to claim 15, wherein the light transmitting layer is made of a material including one or more of nitrocellulose, cellulose ester, and polytetrafluoroethylene; and the light shielding layer is made of a material including cellulose acetate.

17. An exposure apparatus, comprising: a light source, a plurality of prisms, and an optical compensation film disposed between the light source and the prisms;
wherein two adjacent prisms partially overlap with each other to define an overlapping portion and a non-overlapping portion;
wherein the optical compensation film comprises a first region of the optical compensation film and a second region of the optical compensation film; the first region of the optical compensation film is positioned to correspond to the overlapping portion of the prisms, and the first region of the optical compensation film is configured to allow light to pass therethrough and impinge on the overlapping portion of the prisms; the second region of the optical compensation film is positioned to correspond to the non-overlapping portion of the prisms, and the second region of the optical compensation film is configured to allow light to pass therethrough and impinge on the non-overlapping portion of the prisms; wherein light transmittance of the first region of the optical compensation film is greater than light transmittance of the second region of the optical compensation film; and
wherein the light source is configured to emit light towards the optical compensation film, where the light impinges on the overlapping portion of the prisms after passing through the first region of the optical compensation film, and the light impinges on the non-overlapping portion of the prisms after passing through the second region of the optical compensation film.

18. The exposure apparatus according to claim 17, wherein the second region of the optical compensation film is made of a material including one or more of nitrocellulose, cellulose ester, and polytetrafluoroethylene; the first region of the optical compensation film is made of a material including one or more of nitrocellulose, cellulose ester, and polytetrafluoroethylene; and a thickness of the first region of the optical compensation film is less than a thickness of the second region of the optical compensation film.

19. The exposure apparatus according to claim 18, wherein the thickness of the second region of the optical compensation film ranges from 0.5 μm to 3 μm, and the thickness of the second region of the optical compensation film is greater than the thickness of the first region of the optical compensation film by 0.2-1 μm.

20. The exposure apparatus according to claim 17, wherein the second region of the optical compensation film is made of a material including one or more of nitrocellulose, cellulose ester, and polytetrafluoroethylene; the first region of the optical compensation film is made of a major material including one or more of nitrocellulose, cellulose ester, and polytetrafluoroethylene; and the first region of the optical compensation film is doped with a doping material including one or more of magnesium fluoride and a siloxane hybrid film.

* * * * *